United States Patent
Liu et al.

(10) Patent No.: US 8,879,811 B2
(45) Date of Patent: Nov. 4, 2014

(54) ALTERNATING DIRECTION OF MULTIPLIERS METHOD FOR PARALLEL MRI RECONSTRUCTION

(71) Applicants: Jun Liu, Plainsboro, NJ (US); Alban Lefebvre, Jersey City, NJ (US); Mariappan Nadar, Plainsboro, NJ (US)

(72) Inventors: Jun Liu, Plainsboro, NJ (US); Alban Lefebvre, Jersey City, NJ (US); Mariappan Nadar, Plainsboro, NJ (US)

(73) Assignee: Siemens Aktiengesellschaft, Munich (DE)

( * ) Notice: Subject to any disclaimer, the term of this patent is extended or adjusted under 35 U.S.C. 154(b) by 73 days.

(21) Appl. No.: 13/778,446

(22) Filed: Feb. 27, 2013

(65) Prior Publication Data
US 2013/0259343 A1    Oct. 3, 2013

Related U.S. Application Data

(60) Provisional application No. 61/616,545, filed on Mar. 28, 2012.

(51) Int. Cl.
  *G06K 9/00* (2006.01)
  *A61B 5/05* (2006.01)
  *G01R 33/561* (2006.01)
  *G06T 11/00* (2006.01)

(52) U.S. Cl.
  CPC .......... *G06T 11/003* (2013.01); *G01R 33/5611* (2013.01)
  USPC .......................................... 382/128; 600/410

(58) Field of Classification Search
  None
  See application file for complete search history.

(56) References Cited

U.S. PATENT DOCUMENTS

| 8,719,194 B2 * | 5/2014 | Qin et al. ................. 706/12 |
| 2013/0188856 A1 * | 7/2013 | Adler et al. ............... 382/132 |

OTHER PUBLICATIONS

Afonso et al. ("An augmented lagrangian approach to the constrained optimization formulation of imaging inverse problems"), IEEE Transactions on Image Processing, vol. 20, No. 3, Mar. 2011.*

* cited by examiner

*Primary Examiner* — Anand Bhatnagar
*Assistant Examiner* — Soo Park

(57) ABSTRACT

A method for reconstructing parallel magnetic resonance images includes providing a set of acquired k-space MR image data y, and finding a target MR image x that minimizes $\frac{1}{2}\|Fv-y\|_2^2 + \lambda\|z\|_1$ where $v=Sx$ and $z=Wx$ where S is a diagonal matrix containing sensitivity maps of coil elements in an MR receiver array, F is an FFT matrix, W is a redundant Haar wavelet matrix, and $\lambda \geq 0$ is a regularization parameter, by updating $$x^{k+1} = (\mu_1 I + \mu_3 S^H S)^{-1}[\mu_1 W^H(z^k - b_z^k) + \mu_3 S^H(v^k - b_v^k)],$$

$$z^{k+1} = \text{soft}\left(Wx^{k+1} + b_z^k, \frac{1}{\mu_1}\right) \text{ where}$$

$$\text{soft}(x, T) = \begin{cases} x+T & \text{if } x \leq -T, \\ 0 & \text{if } |x| \leq T, \\ x-T & \text{if } x \geq T, \end{cases}$$

and $$v^{k+1} = (F^H F + \mu_3 I)^{-1}[F^H y + \mu_3(Sx^{k+1} + b_v^k)],$$

where k is an iteration counter, $\mu_1$ and $\mu_3$ are parameters of an augmented Lagrangian function, and $b_z$ and $b_v$ are dual variables of the augmented Lagrangian.

26 Claims, 6 Drawing Sheets

ALTERNATING DIRECTION OF MULTIPLIERS METHOD FOR PARALLEL MRI RECONSTRUCTION

CROSS REFERENCE TO RELATED UNITED STATES APPLICATIONS

This application claims priority from "ADMM for Parallel MRI Reconstruction", U.S. Provisional Application No. 61/616,545 of Liu, et al., filed Mar. 28, 2012, and the contents of which are herein incorporated by reference in their entireties.

TECHNICAL FIELD

This disclosure is directed to methods for parallel reconstruction of digital images.

DISCUSSION OF THE RELATED ART

Magnetic resonance imaging (MRI) is a medical imaging technique used in radiology to visualize internal structures of the body in detail. As a non-invasive imaging technique, MRI makes use of nuclear magnetic resonance to image nuclei of atoms inside the body. MRI has been used for imaging the brain, muscles, the heart, cancers, etc.

The raw data acquired by an MR scanner are the Fourier coefficients, or the so-called k-space data. The k-space data are typically acquired by a series of phase encodings, in which each phase encoding includes a given amount of k-space data that are related to the sampling. For example, with Cartesian sampling, 256 frequency encodings are needed to cover the full k-space of one 256×256 image. The time between the repetitions of the sequence is called the repetition time (TR) and is a measure of the time needed for acquiring one phase encoding. For example, if TR=50 ms, it takes about 12.8 seconds to acquire a full k-space data of one 256×256 image with Cartesian sampling. With the same TR, it takes about 15.4 minutes to acquire the full k-space of a 256×256×72 volume. With higher spatial resolution, the time for acquiring a full k-space increases. To reduce the acquisition time, one may undersample the k-space, i.e., reduce the number of acquired phase encodings.

Parallel imaging has been proven effective for reducing acquisition time. Parallel imaging exploits differences in sensitivities between individual coil elements in a receiver array to reduce the number of gradient encodings required for imaging. Parallel imaging tries to reconstruct the target image with the undersampled k-space data.

In parallel MRI, one is provide with the k-space observations from c coils as $$y_i = F_u S_i x, \quad (1)$$

where x is the target MR image to be reconstructed, $S_i$ is a diagonal matrix containing the coil sensitivity map of the ith-coil, and $F_u$ is a partial FFT matrix. Assuming a Cartesian sampling pattern, one has $F_u F_u^H = I$.

Denoting the measurement matrix as $$A = FS \quad (2)$$

where $$F = \text{diag}(F_{u,1}, F_{u,2}, \ldots, F_{u,c}) \quad (3)$$

is the complete FFT matrix, and $$S = [S_1, S_2, \ldots, S_c]^H, \quad (4)$$

composes the coil sensitivity estimations of all the c coils. The coil sensitivity maps may be normalized so that $S^H S = I$, where the 'H' denotes a Hermitian adjoint matrix.

The relationship between the image x and the k-space observations $y = [y_1, y_2, \ldots, y_c]$ can be represented as $$y = Ax. \quad (5)$$

Sparsity has been employed as a prior for parallel MRI reconstruction. Making use of the $l_1$ regularization of the redundant Haar wavelets, one can estimate x by solving the following 2 formulations.

An unconstrained formulation computes x by optimizing $$\min_x \frac{1}{2}\|Ax - y\|_2^2 + \lambda\|Wx\|_1, \quad (6)$$

where W represents the redundant Haar wavelets, and $\lambda$ is a parameter that trades data fidelity with the $l_1$ regularization. Note that, although W is not invertible, $W^H W = I$.

A constrained formulation computes x by optimizing $$\min_{x: \|Ax-y\|_2 \le \varepsilon} \|Wx\|_1 \quad (7)$$

where $\varepsilon$ represents the allowed discrepancy between the prediction and the observed k-space data.

SUMMARY

Exemplary embodiments of the invention as described herein generally include methods for alternating direction of multipliers (ADMM) for parallel MRI reconstruction by the $l_1$ regularization of redundant Haar wavelets. Embodiments of the invention split both the data fidelity term and the non-smooth regularization term for an efficient, closed form update of the associated variables. In addition, embodiments of the invention introduce as few auxiliary variables as possible to save computation and storage cost. Embodiments of the invention set the ADMM parameters in a data dependent way to ensure fast convergence.

According to an embodiment of the invention, there is provided a method for reconstructing parallel magnetic resonance images (MRI), including providing a set of acquired k-space MR image data y, and finding a target MR image x that minimizes $\frac{1}{2}\|Fv - y\|_2^2 + \lambda\|z\|_1$ where v=Sx and z=Wx where S is a diagonal matrix containing sensitivity maps of coil elements in an MR receiver array, F is an FFT matrix where $FF^H = I$ and H denotes a Hermitian adjoint matrix, W is a redundant Haar wavelet matrix satisfying $W^T W = I$, where I is an identity matrix, and $\lambda \ge 0$ is a regularization parameter, by updating $$x^{k+1} = (\mu_1 I + \mu_3 S^H S)^{-1}[\mu_1 W^H(z^k - b_z^k) + \mu_3 S^H(v^k - b_v^k)],$$

$$z^{k+1} = \text{soft}\left(Wx^{k+1} + b_z^k, \frac{1}{\mu_1}\right) \text{ where }$$

$$\text{soft}(x, T) = \begin{cases} x + T & \text{if } x \le -T, \\ 0 & \text{if } |x| \le T, \\ x - T & \text{if } x \ge T, \end{cases}$$

and $$v^{k+1} = (F^H F + \mu_3 I)^{-1}[F^H y + \mu_3(Sx^{k+1} + b_v^k)],$$

where k is an iteration counter, $\mu_1$ and $\mu_3$ are parameters of an augmented Lagrangian function $$L(x, z, v, b_z, b_v) = \frac{1}{2}\|Fv - y\|_2^2 + \lambda\|z\|_1 + \frac{\mu_1}{2}\|Wx - z\|_2^2 +$$
$$\frac{\mu_3}{2}\|Sx - v\|_2^2 + \mu_1\langle b_z, Wx - z + y\rangle + \mu_3\langle b_v, Sx - v\rangle,$$

and $b_z$ and $b_v$ are dual variables of the augmented Lagrangian.

According to a further aspect of the invention, $v^{k+1}$ can be updated as $$v^{k+1} = (Sx^{k+1} + b_v^k) + \frac{\tau}{\tau+1}F^H(y - F(Sx^{k+1} + b_v^k)) \text{ where } \tau = 1/\mu_3.$$

According to a further aspect of the invention, $\lambda \le \|WA^H y\|_\infty$.

According to a further aspect of the invention, $\mu_1 = \mu_3 < 1$.

According to a further aspect of the invention, the method includes updating the dual variables as $b_z^{k+1} = b_z^k + (Wx^{k+1} - z^{k+1})$ and $b_v^{k+1} = b_v^k + (Sx^{k+1} - v^{k+1})$.

According to a further aspect of the invention, $x^k$, $z^k$, and $v^k$, and dual variables $b_z^k$ and $b_v^k$ are initialized to zero.

According to a further aspect of the invention, $x^k$, $z^k$, and $v^k$ are updated until a relative difference between a current iteration estimate and a previous iteration estimate fall below a predefined threshold.

According to another aspect of the invention, there is provided a method for reconstructing parallel magnetic resonance images (MRI), including providing a set of acquired k-space MR image data y, and finding a target MR image x that optimizes $$\min_x \|z\|_1 + S_\varepsilon(u)$$
$$\text{s.t. } z = Wx, u = Fv - y, v = Sx,$$

where $v = Sx$ and $z = Wx$ where S is a diagonal matrix containing sensitivity maps of coil elements in an MR receiver array, F is an FFT matrix where $FF^H = I$ and H denotes a Hermitian adjoint matrix, W is a redundant Haar wavelet in matrix satisfying $W^T W = I$, where I is an identity matrix, $\lambda \ge 0$ is a regularization parameter, $$S_\varepsilon(u) = \begin{cases} 0, & \|u\|_2 \le \varepsilon, \\ \infty & \|u\|_2 > \varepsilon, \end{cases}$$

and $\varepsilon$ represents an allowed discrepancy between the target image x and the observed k-space data y, by updating $$x^{k+1} = (\mu_1 I + \mu_3 S^H S)^{-1}[\mu_1 W^H(z^k - b_z^k) + \mu_3 S^H(v^k - b_v^k)],$$
$$z^{k+1} = \text{soft}\left(Wx^{k+1} + b_z^k, \frac{1}{\mu_1}\right) \text{ where}$$
$$\text{soft}(x, T) = \begin{cases} x + T & \text{if } x \le -T, \\ 0 & \text{if } \|x\| \le T, \\ x - T & \text{if } x \ge T, \end{cases}$$
$$v^{k+1} = (\mu_2 F^H F + \mu_3 I)^{-1}[\mu_2(F^H(y + u^k + b_u^k)) + \mu_3(Sx^{k+1} + b_v^k)],$$
and
$$u^{k+1} = \text{shrink}(Fv^{k+1} - y - b_u^k, \varepsilon) \text{ where}$$

-continued
$$\text{shrink}(x, T) = \begin{cases} 0 & \text{if } |x| \le T, \\ x & \text{if } |x| > T, \end{cases}$$

where k is an iteration counter, $\mu_1$, $\mu_2$ and $\mu_3$ are parameters of an augmented Lagrangian function $$L(x, z, u, v, b_z, b_u, b_v) = \|z\|_1 + S_\varepsilon(u) + \frac{\mu_1}{2}\|Wx - z\|_2^2 + \frac{\mu_2}{2}\|Fv - y - u\|_2^2 +$$
$$\frac{\mu_3}{2}\|Sx - v\|_2^2 + \mu_1\langle b_z, Wx - z\rangle + \mu_2\langle b_u, u - Fv + y\rangle + \mu_3\langle b_v, Sx - v\rangle,$$

and $b_z$, $b_u$ and $b_v$ are dual variables of the augmented Lagrangian.

According to a further aspect of the invention, the method includes updating the dual variables as $b_z^{k+1} = b_z^k + (Wx^{k+1} - z^{k+1})$, $b_u^{k+1} = b_u^k + (u^{k+1} - Fv^{k+1} + y)$, and $b_v^{k+1} = b_v^k + (Sx^{k+1} - v^{k+1})$.

According to a further aspect of the invention, $\varepsilon \le \|y\|_2$.

According to a further aspect of the invention, $\mu_1$, $\mu_2$, and $\mu_3$ are set as $\mu_1 = \mu_3 = 0.1\rho$ and $\mu_2 = \rho$ where $$\rho = \frac{1}{0.01\|WA^H y\|_\infty}.$$

According to a further aspect of the invention, $x^k$, $z^k$, $v^k$, and $u^k$, and dual variables $b_z^k$, $b_u^k$, and $b_v^k$ are initialized to zero.

According to a further aspect of the invention, $x^k$, $z^k$, $v^k$ and $u^k$ are updated until a relative difference between a current iteration estimate and a previous iteration estimate fall below a predefined threshold.

According to another aspect of the invention, there is provided a non-transitory program storage device readable by a computer, tangibly embodying a program of instructions executed by the computer to perform the method steps for reconstructing parallel magnetic resonance images (MRI).

DETAILED DESCRIPTION OF EXEMPLARY EMBODIMENTS

Figure 1:
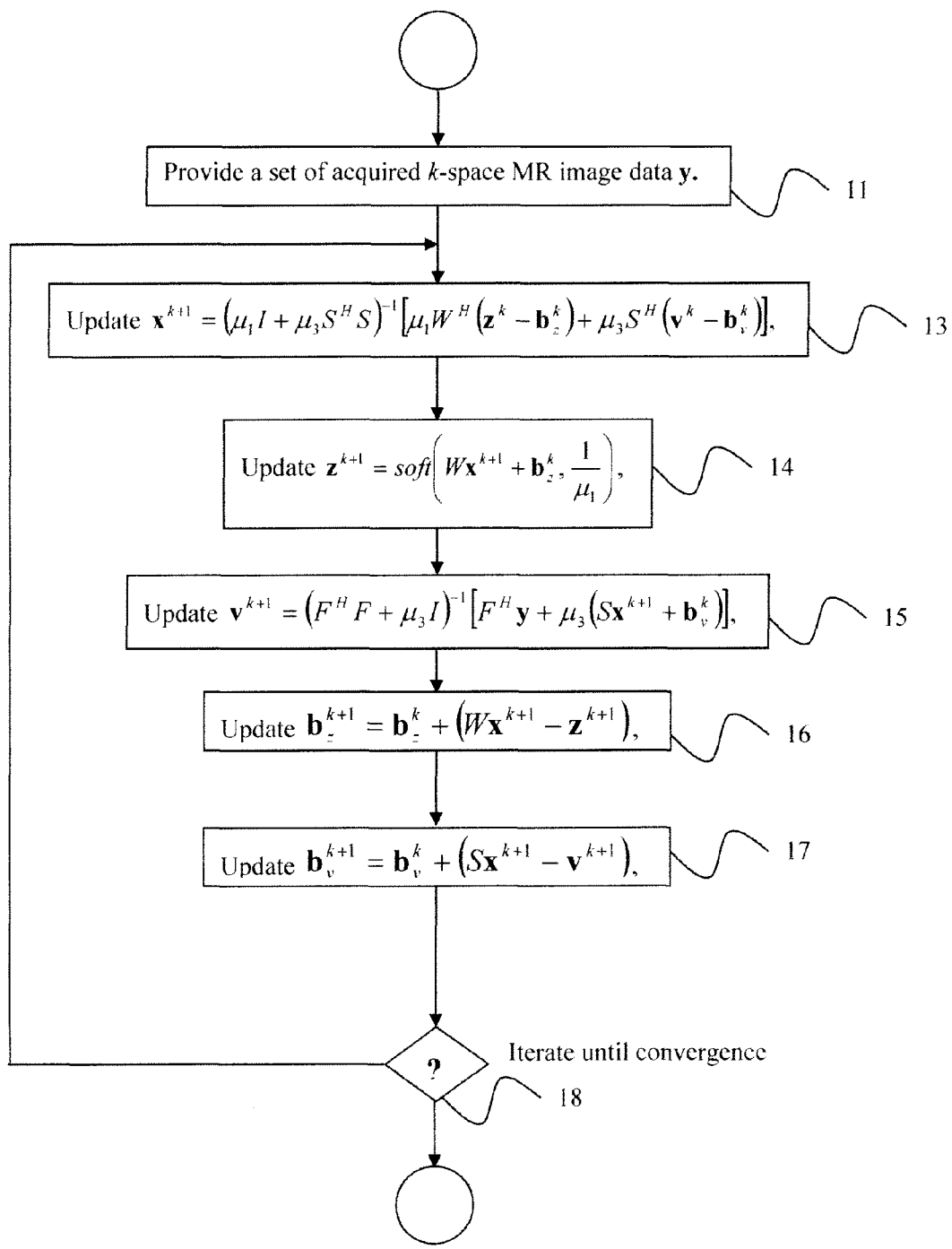
FIG. 1 is a flowchart of an unconstrained ADMM algorithm according to an embodiment of the invention.

Exemplary embodiments of the invention as described herein generally include systems and methods for alternating direction of multipliers (ADMM) for parallel MRI reconstruction. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

As used herein, the term "image" refers to multi-dimensional data composed of discrete image elements (e.g., pixels for 2-dimensional images and voxels for 3-dimensional images). The image may be, for example, a medical image of a subject collected by computer tomography, magnetic resonance imaging, ultrasound, or any other medical imaging system known to one of skill in the art. The image may also be provided from non-medical contexts, such as, for example, remote sensing systems, electron microscopy, etc. Although an image can be thought of as a function from $R^3$ to $R$ or $R^7$, the methods of the inventions are not limited to such images, and can be applied to images of any dimension, e.g., a 2-dimensional picture or a 3-dimensional volume. For a 2- or 3-dimensional image, the domain of the image is typically a 2- or 3-dimensional rectangular array, wherein each pixel or voxel can be addressed with reference to a set of 2 or 3 mutually orthogonal axes. The terms "digital" and "digitized" as used herein will refer to images or volumes, as appropriate, in a digital or digitized format acquired via a digital acquisition system or via conversion from an analog image.

An alternating direction of multipliers method (ADMM) has been proposed for solving both the unconstrained and constrained optimizations. According to embodiments of the invention, when applying ADMM to solve EQS. (6) and (7), auxiliary variables are introduced to split both the data fidelity term $\frac{1}{2}\|Ax-y\|_2^2$ and the regularization term $\lambda\|Wx\|_1$. Embodiments of the invention can update all variables, both primal and dual, in closed form, and use redundant Haar wavelets to save a set of variables.

Embodiments of the invention can solve EQ. (6) by introducing a splitting variable $$v = Sx,$$

for the data fidelity term, and $$z = Wx$$

for the $l_1$ regularization term.

FIG. 1 is a flowchart of an unconstrained ADMM algorithm according to an embodiment of the invention. Referring now to the figure, given a set of acquired k-space MR image data y at step 11, according to an embodiment of the invention, EQ. (6) can be written as $$\min_x \frac{1}{2}\|Fv - y\|_2^2 + \lambda\|z\|_1 \quad (8)$$
$$\text{s.t.} \quad z = Wx, v = Sx.$$

According to an embodiment of the invention, the augmented Lagrangian of EQ. (8) can be written as $$L(x, z, v, b_z, b_v) = \frac{1}{2}\|Fv - y\|_2^2 + \lambda\|z\|_1 + \frac{\mu_1}{2}\|Wx - z\|_2^2 + \frac{\mu_3}{2}\|Sx - v\|_2^2 + \mu_1\langle b_z, Wx - z + y\rangle + \mu_3\langle b_v, Sx - v\rangle \quad (9)$$

where x, z, v are primal variables, and $b_z$, $b_v$ are dual variables.

A conventional augmented Lagrangian (AL) updates the primal variables by solving $$(x^{k+1}, z^{k+1}, v^{k+1}) = \operatorname*{argmin}_{x,z,v} L(x, z, v, b_z^k, b_v^k) \quad (10)$$

A conjugate gradient method may be used to solve EQ. (10), however, this can be computationally expensive.

In an ADMM according to an embodiment of the invention, a given primal variable may be updated by fixing other variables as follows:

$$x^{k+1} = \operatorname*{argmin}_x L(x, z^k, v^k, b_z^k, b_v^k) \quad (11)$$

$$z^{k+1} = \operatorname*{argmin}_x L(x^{k+1}, z, v^k, b_z^k, b_v^k) \quad (12)$$

$$v^{k+1} = \operatorname*{argmin}_x L(x^{k+1}, z^{k+1}, v, b_z^k, b_v^k) \quad (13)$$

Due to the introduction of the splitting variables z and v, all of the primal variables can be updated in closed form as, with reference to the steps of FIG. 1:

$$x^{k+1} = (\mu_1 I + \mu_3 S^H S)^{-1}[\mu_1 W^H(z^k - b_z^k) + \mu_3 S^H(v^k - b_v^k)], \quad \text{(step 13)(14)}$$

$$z^{k+1} = \operatorname{soft}\left(Wx^{k+1} + b_z^k, \frac{1}{\mu_1}\right), \quad \text{(step 14)(15)}$$

$$v^{k+1} = (F^H F + \mu_3 I)^{-1}[F^H y + \mu_3(Sx^{k+1} + b_v^k)], \quad \text{(step 15)(16)}$$

where $\operatorname{soft}(x, T) = \begin{cases} x + T & \text{if } x \leq -T, \\ 0 & \text{if } |x| \leq T, \\ x - T & \text{if } x \geq T, \end{cases}$ is the soft shrinkage operator.

Since S is a diagonal matrix, $(\mu_1 I + \mu_3 S^H S)^{-1}$ can be computed in linear time. In addition, if the coil sensitivity maps are normalized so that $S^H S = I$, this computation can be further simplified.

By using $$(I + \tau F^H F)^{-1} = I - \tau \frac{F^H F}{\tau + 1},$$

embodiments of the invention can rewrite $v^{k+1}$ as $$v^{k+1} = (Sx^{k+1} + b_v^k) + \frac{\tau}{\tau + 1} F^H(y - F(Sx^{k+1} + b_v^k)), \quad (17)$$

where $\tau = 1/\mu_3$.

Referring again to FIG. 1, according to an embodiment of the invention, the dual variables can be updated by dual ascent as follows, with reference to the steps of FIG. 1:

$$b_z^{k+1} = b_z^k + (Wx^{k+1} - z^{k+1}), \quad \text{(step 16)(18)}$$

$$b_v^{k+1} = b_v^k + (Sx^{k+1} - v^{k+1}), \quad \text{(step 17)(19)}$$

Steps 13 to 17 will be repeated from step 18 until convergence.

According to an embodiment of the invention, each iteration costs: (1) one operation of S and operation of $S^H$, whose cost is linear in n, the image size and c, the number of coils; (2) c operations of $F_\mu$ and $F_u^H$, and these two operations can be computed in n log(n) time, where n is the image size; and (3) one operation of W and one operation of $W^H$, whose computational cost is linear in n, the image size. Therefore, according to an embodiment of the invention, the per iteration cost is cn log(n).

According to an embodiment of the invention, to solve EQ. (7), let $$S_\varepsilon(u) = \begin{cases} 0, & \|u\|_2 \le \varepsilon, \\ \infty & \|u\|_2 > \varepsilon, \end{cases} \quad (20)$$

and introduce the splitting variables $$u = Fv - y,$$

$$v = Sx,$$

$$z = Wx.$$

Figure 2:
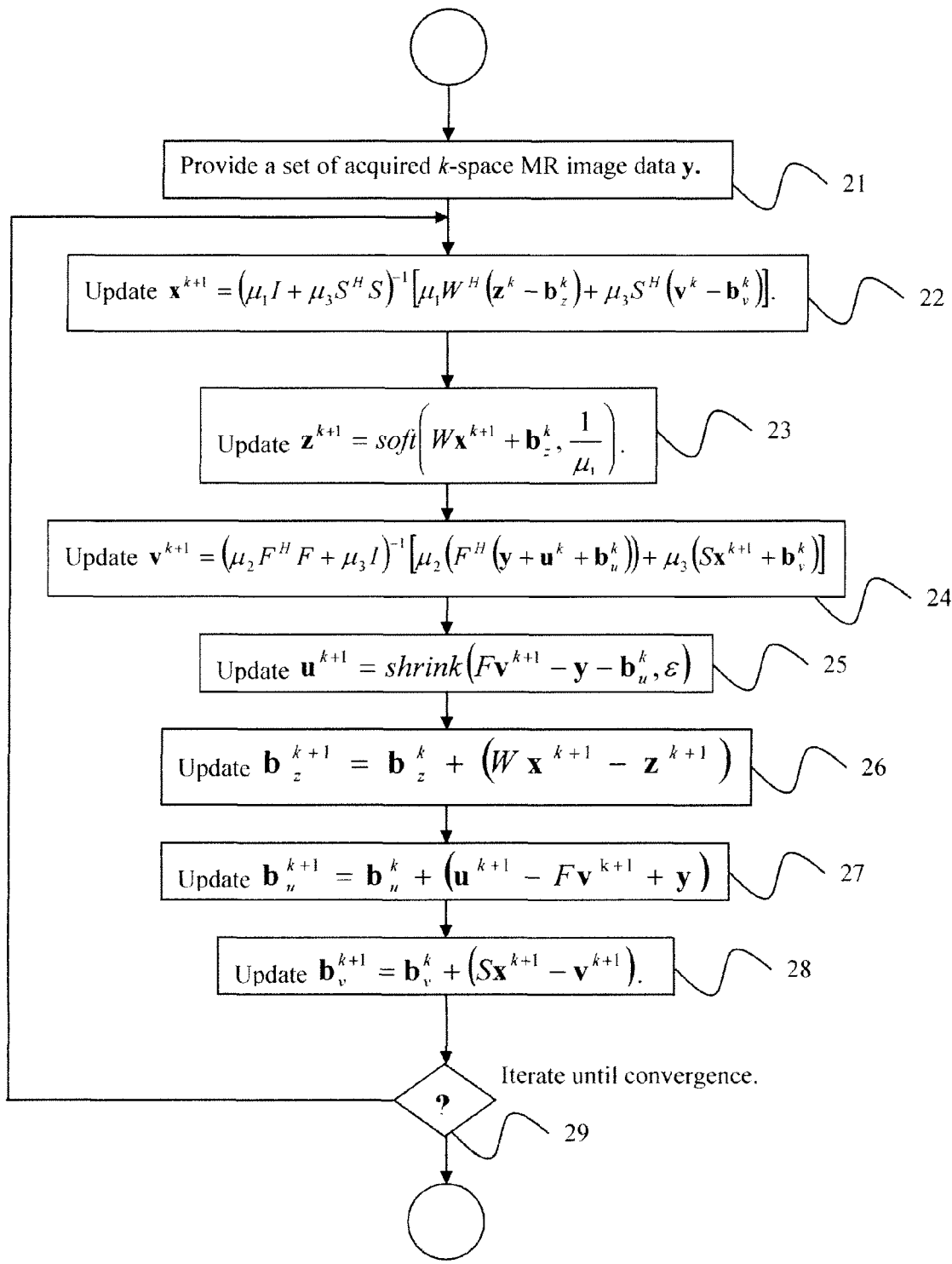
FIG. 2 is a flowchart of a constrained ADMM algorithm according to an embodiment of the invention.

FIG. 2 is a flowchart of a constrained ADMM algorithm according to an embodiment of the invention. Referring now to the figure, given a set of acquired k-space MR image data y at step 21, EQ. (7) can be written according to an embodiment of the invention as $$\min_x \|z\|_1 + S_\varepsilon(u) \quad (21)$$
$$\text{s.t. } z = Wx, u = Fv - y, v = Sx.$$

According to an embodiment of the invention, the augmented Lagrangian of EQ. (15) can be written as $$L(x, z, u, v, b_z, b_u, b_v) = \quad (22)$$
$$\|z\|_1 + S_\varepsilon(u) + \frac{\mu_1}{2}\|Wx - z\|_2^2 + \frac{\mu_2}{2}\|Fv - y - u\|_2^2 + \frac{\mu_3}{2}\|Sx - v\|_2^2 +$$
$$\mu_1\langle b_z, Wx - z\rangle + \mu_2\langle b_u, u - Fv + y\rangle + \mu_3\langle b_v, Sx - v\rangle.$$

Embodiments can update the primal variables as follows, with reference to the steps of FIG. 2:

$$x^{k+1} = (\mu_1 I + \mu_3 S^H S)^{-1}[\mu_1 W^H(z^k - b_z^k) + \mu_3 S^H(v^k - b_v^k)], \quad \text{(step 22)(23)}$$

$$z^{k+1} = \text{soft}\left(Wx^{k+1} + b_z^k, \frac{1}{\mu_1}\right), \quad \text{(step 23)(24)}$$

$$v^{k+1} = \quad \text{(step 24)(25)}$$
$$(\mu_2 F^H F + \mu_3 I)^{-1}[\mu_2(F^H(y + u^k + b_u^k)) + \mu_3(Sx^{k+1} + b_v^k)]$$

$$u^{k+1} = \text{shrink}(Fv^{k+1} - y - b_u^k, \varepsilon) \quad \text{(step 25)(26)}$$

and can update the dual variables as follows:

$$b_z^{k+1} = b_z^k + (Wx^{k+1} - z^{k+1}), \quad \text{(step 26)(27)}$$

$$b_u^{k+1} = b_u^k + (u^{k+1} - Fv^{k+1} + y), \quad \text{(step 27)(28)}$$

$$b_v^{k+1} = b_v^k + (Sx^{k+1} - v^{k+1}), \quad \text{(step 28)(29)}$$

As in an unconstrained embodiment, steps 22 to 28 can be repeated from step 29 until convergence.

In the above constrained and unconstrained formulations according to embodiments of the invention, both the primal and dual variables can be initialized to zero. Note that the FFT and redundant Haar matrices F and W are fixed, standard quantities. One exemplary, non-limiting convergence criteria for stopping the iterations is when the relative difference between current iteration estimate and the previous iteration estimate is below a certain threshold.

According to an embodiment of the invention, an analysis similar to that conducted for the solution of EQ. (6) yields a per iteration cost to also be cn log(n).

According to an embodiment of the invention, parameters can be set in a data-dependent manner.

Parameter $\lambda$:

In the unconstrained EQ. (6), embodiments of the invention can set $\lambda$ as a ratio of $\lambda_{max}$ defined as:

$$\lambda_{max} = \|WA^H y\|_\infty. \quad (30)$$

Theorem 1:

For the unconstrained EQ. (6), if $\lambda \ge \lambda_{max}$ defined in EQ. (30), then the solution of EQ. (6) is zero.

Proof:

According to an embodiment of the invention, the optimality condition of EQ. (6) is as follows: x* is an optimal solution of EQ. (6) if and only if $$0 \in A^H Ax^* - A^H y + \lambda W^H SGN(Wx^*) \quad (31)$$

where SGN( ) is the sign function.

If $\lambda \ge \lambda_{max}$, one has $$WA^H y \in \lambda SGN(0).$$

Therefore, $$A^H y \in \lambda W^H SGN(0).$$

Thus, it follows from EQ. (31) that zero is a solution of EQ. (6). □

Theorem 1 provides a data dependent maximal value for $\lambda$, i.e., $\lambda \le \|WA^H y\|_\infty$. This $\lambda_{max}$ is dependent on the k-space observations y, the coil sensitivity maps S, and the sampling patterns specified by F.

Figure 3:
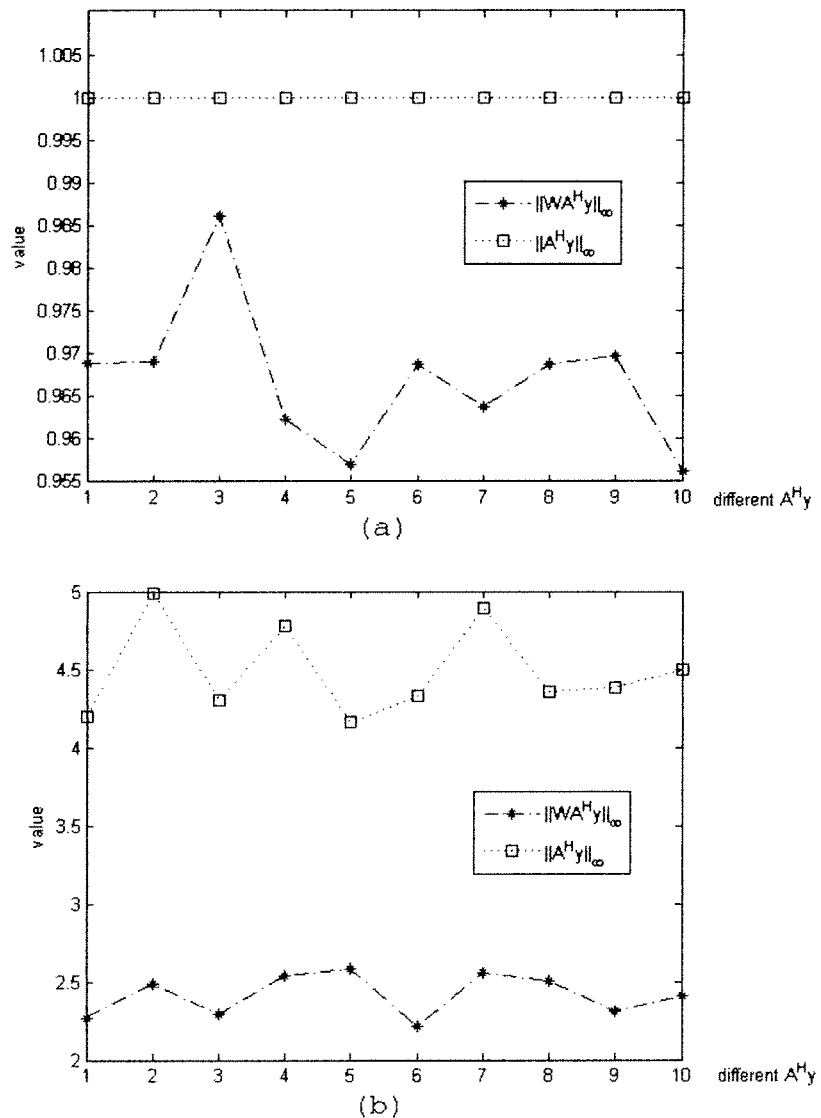
FIGS. 3(a)-(b) illustrates values for $\lambda WA^H y\|_\infty$ and $\|A^H y\|_\infty$, according to an embodiment of the invention.

FIGS. 3(a)-(b) illustrates experimentally obtained values for $\|WA^H y\|_\infty$ and $\|A^H y\|_\infty$, according to an embodiment of the invention, and show that the following relationship usually holds:

$$\|WA^H y\|_\infty < \|A^H y\|_\infty \quad (32)$$

Strictly speaking, the above inequality does not hold mathematically, e.g., when y=0, the left hand side and the right hand side are equal. However, according to an embodiment of the invention, the empirical finding of EQ. (32) enables one to finely tune the parameter $\lambda$. When the entries are generated from a uniform distribution over [0,1], there is almost no change in $\|A^H y\|_\infty$, while $\|WA^H y\|_\infty$ can capture such as change in $A^H y$.

Furthermore, if $\lambda$ is set in the interval $\|A^H y\|_\infty[0,1]$, as shown in FIG. 3(a), almost half of the interval is useless. Experimental results according to embodiments of the invention show that an optimal value for $\lambda$ usually lies in the interval $\lambda_{max}[0.001, 0.02]$.

Parameter $\epsilon$:

For the constrained optimization of EQ. (7), embodiments of the invention can define $$\epsilon_{max} = \|y\|_2. \quad (33)$$

Theorem 2:

When $\epsilon \geq \epsilon_{max}$, zero is a solution to EQ. (7).

Proof:

When $\epsilon \geq \epsilon_{max}$, zero is clearly a solution to EQ. (7). □

Parameters $\mu_1$, $\mu_3$ for Unconstrained ADMM Variable Split:

According to an embodiment of the invention, it follows from EQ. (9) that: (1) large values of $\mu_1$ and $\mu_3$ place too much emphasis on the equality constraints Wx=z and Sx=v, but not enough on the data fidelity term $\frac{1}{2}\|Fv-y\|_2^2$; and (2) small values of $\mu_1$ and $\mu_3$ primarily emphasize the data fidelity term $\frac{1}{2}\|Fv-y\|_2^2$ but insufficiently emphasize the equality constraints Wx=z and Sx=v. Theoretically, for any $\mu_1$, $\mu_3 > 0$, an unconstrained ADMM variable split according to an embodiment of the invention is guaranteed to converge, but its efficiency depends on the choice of $\mu_1$ and $\mu_3$.

In an unconstrained ADMM variable split according to an embodiment of the invention, $\mu_1$ and $\mu_3$ are set as $\mu_1 = \mu_3 = 0.1$ based on the following considerations: (1) for $\frac{1}{2}\|Wx-z\|_2^2$ and $\frac{1}{2}\|Sx-v\|_2^2$, the maximal eigenvalues of the Hessian matrices are all identity matrices, thus embodiments may set $\mu_1 = \mu_3$; and (2) $\frac{1}{2}\|Fv-y\|_2^2$, being the data fidelity term, needs to be given a high weight, which implies setting $\mu_1$ and $\mu_3$ to a value less than 1.

Parameters $\mu_1$, $\mu_2$, $\mu_3$ for the Constrained ADMM Variable Split:

According to an embodiment of the invention, it follows from EQ. (22) that: (1) large values of $\mu_1$, $\mu_2$, and $\mu_3$ de-emphasize the $l_1$ penalty; and (2) small values of $\mu_1$, $\mu_2$, and $\mu_3$ do not handle well the equality constraints Wx=z, u=Fv-y, and Sx=v for at least the first few iterations. Theoretically, for any $\mu_1$, $\mu_2$, $\mu_3 > 0$, a constrained ADMM variable split according to an embodiment of the invention is guaranteed to converge, but its efficiency depends on the choice of $\mu_1$, $\mu_2$, and $\mu_3$.

According to an embodiment of the invention, $$\rho = \frac{1}{0.01\lambda_{max}},$$

where $\lambda_{max}$ is defined as in EQ. (30), i.e., $\lambda_{max} = \|WA^H y\|_\infty$. In a constrained ADMM variable split according to an embodiment of the invention, $\mu_1$, $\mu_2$, and $\mu_3$ are set as $\mu_1 = \mu_3 = 0.1\rho$, $\mu_2 = \rho$ based on the following considerations: (1) for $\frac{1}{2}\|Wx-z\|_2^2$ and $\frac{1}{2}\|Sx-v\|_2^2$, the maximal eigenvalues of the Hessian matrices are all identity matrices, thus embodiments may set $\mu_1 = \mu_3$; (2) $\frac{1}{2}\|Fv-y\|_2^2$, being the data fidelity term, needs to be given a high weight, which implies setting $\mu_2 = 10\mu_1 = 10\mu_3$; (3) $S_\epsilon(u)$, being a set, is invariant to any parameter; and (4) to balance the term $\|z\|_1$ with the constraints, the related terms for z are $$\|z\|_1 + \frac{\mu_1}{2}\|Wx - z\|_2^2 + \mu_1 \langle b_z, Wx - z \rangle,$$

and the soft shrinkage value is $$\frac{1}{\mu_1}.$$

Experiments with an unconstrained optimization according to an embodiment of the invention indicate that $$\frac{1}{\mu_1} = 0.001\lambda_{max}$$

can yield a good reconstructed image.

Figure 4:
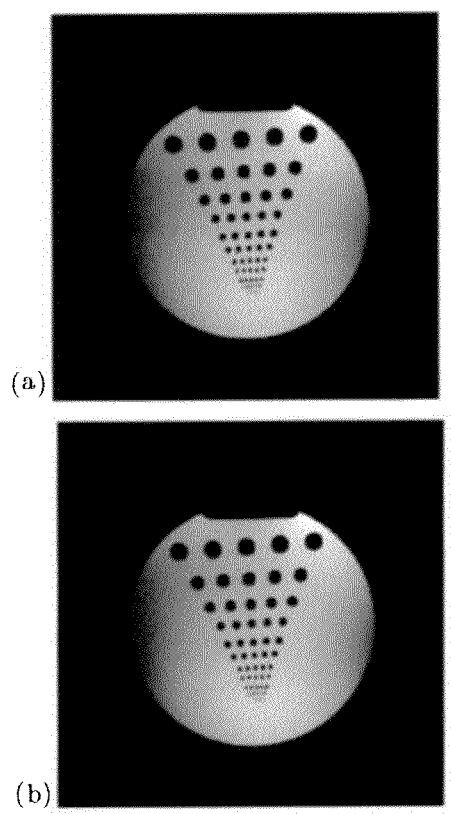
FIGS. 4(a)-(b) illustrates parallel MRI reconstruction by FISTA and ADMM on a scanned phantom, according to an embodiment of the invention.
Figure 5:
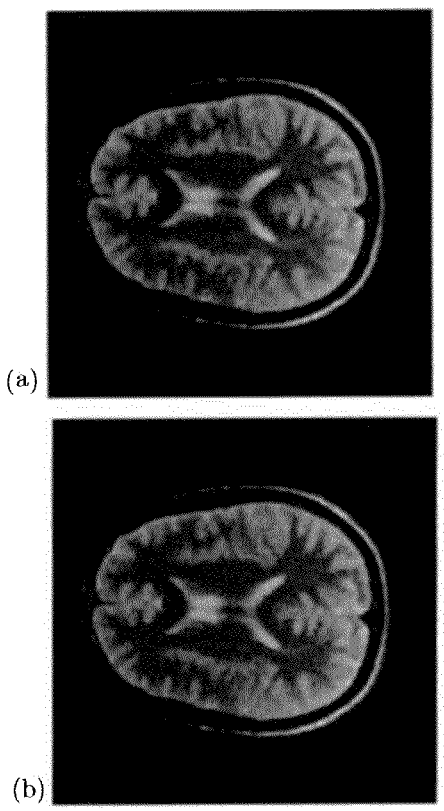
FIGS. 5(a)-(b) illustrates parallel MRI reconstruction by FISTA and ADMM on an in-vivo brain image, according to an embodiment of the invention.

Experiments of a parallel MRI reconstruction according to an embodiment of the invention were conducted on two data sets, a scanned phantom and a set acquired from healthy volunteers on a 3.0T clinical MR scanner. Imaging parameters includes a field of view=300×300 mm², matrix=256×256, 10 coil elements, and a flip angle=12°. FIGS. 4(a)-(b) shows reconstruction results for a FISTA algorithm (FIG. 4(a)) and an unconstrained ADMM variable split according to an embodiment of the invention (FIG. 4(b)) on the scanned phantom, and FIGS. 3(a)-(b) shows reconstruction results for a FISTA algorithm (FIG. 5(a)) and an unconstrained ADMM variable split according to an embodiment of the invention (FIG. 5(b)) on the an in-vivo brain image from a healthy volunteer.

It is to be understood that the present invention can be implemented in various forms of hardware, software, firmware, special purpose processes, or a combination thereof. In one embodiment, the present invention can be implemented in software as an application program tangible embodied on a computer readable program storage device. The application program can be uploaded to, and executed by, a machine comprising any suitable architecture.

Figure 6:
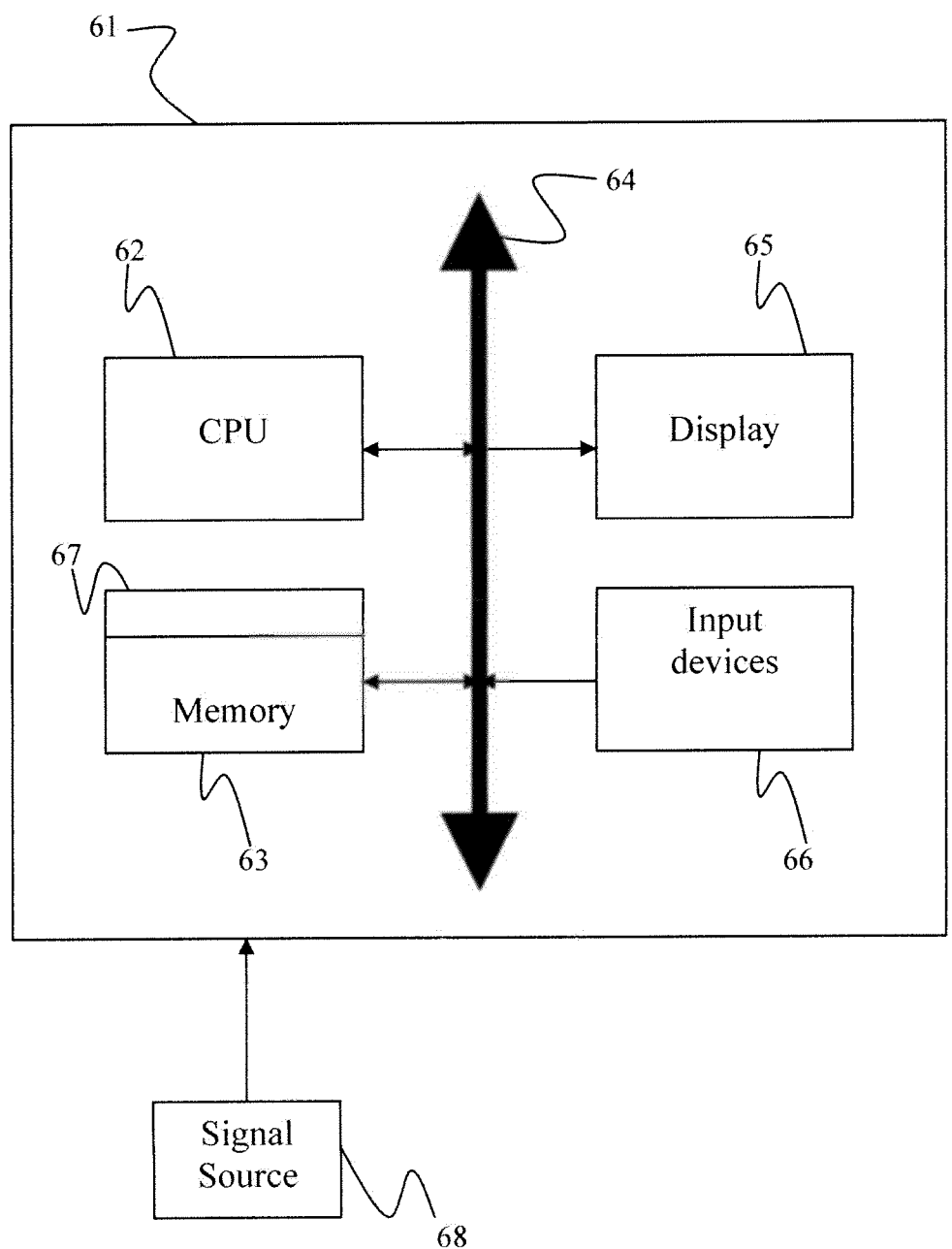
FIG. 6 is a block diagram of an exemplary computer system for implementing an ADMM algorithm for parallel MRI reconstruction, according to an embodiment of the invention.

FIG. 6 is a block diagram of an exemplary computer system for implementing an ADMM algorithm for parallel MRI reconstruction, according to an embodiment of the invention. Referring now to FIG. 6, a computer system 61 for implementing the present invention can comprise, inter alia, a central processing unit (CPU) 62, a memory 63 and an input/output (I/O) interface 64. The computer system 61 is generally coupled through the I/O interface 64 to a display 65 and various input devices 66 such as a mouse and a keyboard. The support circuits can include circuits such as cache, power supplies, clock circuits, and a communication bus. The memory 63 can include random access memory (RAM), read only memory (ROM), disk drive, tape drive, etc., or a combinations thereof. The present invention can be implemented as a routine 67 that is stored in memory 63 and executed by the CPU 62 to process the signal from the signal source 68. As such, the computer system 61 is a general purpose computer system that becomes a specific purpose computer system when executing the routine 67 of the present invention.

The computer system 61 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

It is to be further understood that, because some of the constituent system components and method steps depicted in the accompanying figures can be implemented in software, the actual connections between the systems components (or the process steps) may differ depending upon the manner in which the present invention is programmed. Given the teachings of the present invention provided herein, one of ordinary skill in the related art will be able to contemplate these and similar implementations or configurations of the present invention.

While the present invention has been described in detail with reference to exemplary embodiments, those skilled in the art will appreciate that various modifications and substitutions can be made thereto without departing from the spirit and scope of the invention as set forth in the appended claims.

What is claimed is:

1. A method for reconstructing parallel magnetic resonance images (MRI), comprising:
providing a set of acquired k-space MR image data y; and
finding a target MR image x that minimizes $\frac{1}{2}\|Fv-y\|_2^2 + \lambda\|z\|_1$ wherein v=Sx and z=Wx wherein S is a diagonal matrix containing sensitivity maps of coil elements in an MR receiver array, F is an FFT matrix wherein $FF^H$=I and H denotes a Hermitian adjoint matrix, W is a redundant Haar wavelet matrix satisfying $W^TW$=I, wherein I is an identity matrix, and $\lambda \geq 0$ is a regularization parameter, by updating $$x^{k+1} = (\mu_1 I + \mu_3 S^H S)^{-1}[\mu_1 W^H(z^k - b_z^k) + \mu_3 S^H(v^k - b_v^k)],$$

$$z^{k+1} = \text{soft}\left(Wx^{k+1} + b_z^k, \frac{1}{\mu_1}\right)$$

wherein $\text{soft}(x, T) = \begin{cases} x+T & \text{if } x \leq -T, \\ 0 & \text{if } |x| \leq T, \\ x-T & \text{if } x \geq T, \end{cases}$ and $$v^{k+1} = (F^H F + \mu_3 I)^{-1}[F^H y + \mu_3(Sx^{k+1} + b_v^k)],$$

wherein k is an iteration counter, $\mu_1$ and $\mu_3$ are parameters of an augmented Lagrangian function $$L(x, z, v, b_z, b_v) = \frac{1}{2}\|Fv - y\|_2^2 + \lambda\|z\|_1 + \frac{\mu_1}{2}\|Wx - z\|_2^2 + \frac{\mu_3}{2}\|Sx - v\|_2^2 + \mu_1\langle b_z, Wx - z + y\rangle + \mu_3\langle b_v, Sx - v\rangle,$$

and $b_z$ and $b_v$ are dual variables of the augmented Lagrangian.

2. The method of claim 1, wherein $v^{k+1}$ can be updated as $$v^{k+1} = (Sx^{k+1} + b_v^k) + \frac{\tau}{\tau+1} F^H(y - F(Sx^{k+1} + b_v^k)) \text{ wherein}$$

$\tau = 1/\mu_3$.

3. The method of claim 1, wherein $\lambda \leq \|WA^H y\|_\infty$.

4. The method of claim 1, wherein $\mu_1 = \mu_3 < 1$.

5. The method of claim 1, further comprising updating the dual variables as $b_z^{k+1} = b_z^k + (Wx^{k+1} - z^{k+1})$ and $b_v^{k+1} = b_v^k + (Sx^{k+1} - v^{k+1})$.

6. The method of claim 5, wherein $x^k$, $z^k$, and $v^k$, and dual variables $b_z^k$ and $b_v^k$ are initialized to zero.

7. The method of claim 1, wherein $x^k$, $z^k$, and $v^k$ are updated until a relative difference between a current iteration estimate and a previous iteration estimate fall below a predefined threshold.

8. A method for reconstructing parallel magnetic resonance images (MRI), comprising:
providing a set of acquired k-space MR image data y; and
finding a target MR image x that optimizes $$\min_x \|z_1\| + S_\varepsilon(u)$$

$$\text{s.t. } z = Wx, u = Fv - y, v = Sx,$$

wherein v=Sx and z=Wx wherein S is a diagonal matrix containing sensitivity maps of coil elements in an MR receiver array, F is an FFT matrix wherein $FF^H$=I and H denotes a Hermitian adjoint matrix, W is a redundant Haar wavelet matrix satisfying $W^TW$=I, wherein I is an identity matrix, $\lambda \geq 0$ is a regularization parameter, $$S_\varepsilon(u) = \begin{cases} 0, & \|u\|_2 \leq \varepsilon, \\ \infty & \|u\|_2 > \varepsilon, \end{cases}$$

and $\varepsilon$ represents an allowed discrepancy between the target image x and the observed k-space data y, by updating $$x^{k+1} = (\mu_1 I + \mu_3 S^H S)^{-1}[\mu_1 W^H(z^k - b_z^k) + \mu_3 S^H(v^k - b_v^k)],$$

$$z^{k+1} = \text{soft}\left(Wx^{k+1} + b_z^k, \frac{1}{\mu_1}\right) \text{ wherein}$$

$\text{soft}(x, T) = \begin{cases} x+T & \text{if } x \leq -T, \\ 0 & \text{if } |x| \leq T, \\ x-T & \text{if } x \geq T, \end{cases}$ $$v^{k+1} = (\mu_2 F^H F + \mu_3 I)^{-1}[\mu_2(F^H(y + u^k + b_u^k)) + \mu_3(Sx^{k+1} + b_v^k)],$$

and $u^{k+1} = \text{shrink}(Fv^{k+1} - y - b_u^k, \varepsilon)$ wherein $\text{shrink}(x, T) = \begin{cases} 0 & \text{if } |x| \leq T, \\ x & \text{if } |x|T, \end{cases}$ wherein k is an iteration counter, $\mu_1$, $\mu_2$ and $\mu_3$ are parameters of an augmented Lagrangian function $$L(x, z, u, v, b_z, b_u, b_v) = \|z\|_1 + S_\varepsilon(u) + \frac{\mu_1}{2}\|Wx - z\|_2^2 + \frac{\mu_2}{2}\|Fv - y - u\|_2^2 + \frac{\mu_3}{2}\|Sx - v\|_2^2 + \mu_1\langle b_z, Wx - z\rangle + \mu_2\langle b_u, u - Fv + y\rangle + \mu_3\langle b_v, Sx - v\rangle,$$

and $b_z$, $b_u$ and $b_v$ are dual variables of the augmented Lagrangian.

9. The method of claim 8, further comprising updating the dual variables as $b_z^{k+1} = b_z^k + (Wx^{k+1} - z^{k+1}),$ $b_u^{k+1} = b_u^k + (u^{k+1} - Fv^{k+1} + y),$ and $b_v^{k+1} = b_v^k + (Sx^{k+1} - v^{k+1}).$ 10. The method of claim 8, wherein $\varepsilon \leq \|y\|_2$.

11. The method of claim 8, wherein $\mu_1$, $\mu_2$, and $\mu_3$ are set as $\mu_1 = \mu_3 = 0.1\rho$ and $\mu_2 = \rho$ wherein $$\rho = \frac{1}{0.01\|WA^H y\|_\infty}.$$

12. The method of claim 9, wherein $x^k$, $z^k$, $v^k$, and $u^k$, and dual variables $b_z^k$, $b_u^k$, and $b_v^k$ are initialized to zero.

13. The method of claim 8, wherein $x^k$, $z^k$, $v^k$ and $u^k$ are updated until a relative difference between a current iteration estimate and a previous iteration estimate fall below a predefined threshold.

14. A non-transitory program storage device readable by a computer, tangibly embodying a program of instructions executed by the computer to perform the method steps for reconstructing parallel magnetic resonance images (MRI), the method comprising the steps of:

providing a set of acquired k-space MR image data y; and finding a target MR image x that minimizes $\frac{1}{2}\|Fv-y\|_2^2 + \lambda\|z\|_1$ wherein v=Sx and z=Wx wherein S is a diagonal matrix containing sensitivity maps of coil elements in an MR receiver array, F is an FFT matrix wherein $FF^H$=I and H denotes a Hermitian adjoint matrix, W is a redundant Haar wavelet matrix satisfying $W^T W$=I, wherein I is an identity matrix, and $\lambda \geq 0$ is a regularization parameter, by updating $$x^{k+1} = (\mu_1 I + \mu_3 S^H S)^{-1}[\mu_1 W^H(z^k - b_z^k) + \mu_3 S^H(v^k - b_v^k)],$$

$$z^{k+1} = \text{soft}\left(Wx^{k+1} + b_z^k, \frac{1}{\mu_1}\right) \text{ wherein}$$

$$\text{soft}(x, T) = \begin{cases} x+T & \text{if } x \leq -T, \\ 0 & \text{if } |x| \leq T, \\ x-T & \text{if } x \geq T, \end{cases}$$

and $$v^{k+1} = (F^H F + \mu_3 I)^{-1}[F^H y + \mu_3(Sx^{k+1} + b_v^k)],$$

wherein k is an iteration counter, $\mu_1$ and $\mu_3$ are parameters of an augmented Lagrangian function $$L(x, z, v, b_z, b_v) = \frac{1}{2}\|Fv - y\|_2^2 + \lambda\|z\|_1 + \frac{\mu_1}{2}\|Wx - z\|_2^2 + \frac{\mu_3}{2}\|Sx - v\|_2^2 + \mu_1\langle b_z, Wx - z + y\rangle + \mu_3\langle b_v, Sx - v\rangle,$$

and $b_z$ and $b_v$ are dual variables of the augmented Lagrangian.

15. The computer readable program storage device of claim 14, wherein $v^{k+1}$ can be updated as $$v^{k+1} = (Sx^{k+1} + b_v^k) + \frac{\tau}{\tau+1}F^H(y - F(Sx^{k+1} + b_v^k)) \text{ wherein}$$

$$\tau = 1/\mu_3.$$

16. The computer readable program storage device of claim 14, wherein $\lambda \leq \|WA^H y\|_\infty$.

17. The computer readable program storage device of claim 14, wherein $\mu_1 = \mu_3 < 1$.

18. The computer readable program storage device of claim 14, the method further comprising updating the dual variables as $b_z^{k+1} = b_z^k + (Wx^{k+1} - z^{k+1})$ and $b_v^{k+1} = b_v^k + (Sx^{k+1} - v^{k+1})$.

19. The computer readable program storage device of claim 18, wherein $x^k$, $z^k$, and $v^k$, and dual variables $b_z^k$ and $b_v^k$ are initialized to zero.

20. The computer readable program storage device of claim 14, wherein $x^k$, $z^k$, and $v^k$ are updated until a relative difference between a current iteration estimate and a previous iteration estimate fall below a predefined threshold.

21. A non-transitory program storage device readable by a computer, tangibly embodying a program of instructions executed by the computer to perform the method steps for reconstructing parallel magnetic resonance images (MRI), the method comprising the steps of:

providing a set of acquired k-space MR image data y; and finding a target MR image x that optimizes $$\min_x \|z\|_1 + S_\varepsilon(u)$$

$$\text{s.t. } z = Wx, u = Fv - y, v = Sx.$$

wherein v=Sx and z=Wx wherein S is a diagonal matrix containing sensitivity maps of coil elements in an MR receiver array, F is an FFT matrix wherein $FF^H$=I and H denotes a Hermitian adjoint matrix, W is a redundant Haar wavelet matrix satisfying $W^T W$=I, wherein I is an identity matrix, $\lambda \geq 0$ is a regularization parameter, $$S_\varepsilon(u) = \begin{cases} 0, & \|u\|_2 \leq \varepsilon, \\ \infty & \|u\|_2 > \varepsilon, \end{cases}$$

and $\varepsilon$ represents an allowed discrepancy between the target image x and the observed k-space data y, by updating $$x^{k+1} = (\mu_1 I + \mu_3 S^H S)^{-1}[\mu_1 W^H(z^k - b_z^k) + \mu_3 S^H(v^k - b_v^k)],$$

$$z^{k+1} = \text{soft}\left(Wx^{k+1} + b_z^k, \frac{1}{\mu_1}\right) \text{ wherein}$$

$$\text{soft}(x, T) = \begin{cases} x+T & \text{if } x \leq -T, \\ 0 & \text{if } |x| \leq T, \\ x-T & \text{if } x \geq T, \end{cases}$$

$$v^{k+1} = (\mu_2 F^H F + \mu_3 I)^{-1}[\mu_2(F^H(y + u^k + b_u^k)) + \mu_3(Sx^{k+1} + b_v^k)],$$

and $$u^{k+1} = \text{shrink}(Fv^{k+1} - y - b_u^k, \varepsilon) \text{ wherein}$$

$$\text{shrink}(x, T) = \begin{cases} 0 & \text{if } |x| \leq T, \\ x & \text{if } |x| > T, \end{cases}$$

wherein k is an iteration counter, $\mu_1$, $\mu_2$ and $\mu_3$ are parameters of an augmented Lagrangian function $$L(x, z, u, v, b_z, b_u, b_v) = \|z\|_1 + S_\varepsilon(u) + \frac{\mu_1}{2}\|Wx - z\|_2^2 + \frac{\mu_2}{2}\|Fv - y - u\|_2^2 + \frac{\mu_3}{2}\|Sx - v\|_2^2 + \mu_1\langle b_z, Wx - z\rangle + \mu_2\langle b_u, u - Fv + y\rangle + \mu_3\langle b_v, Sx - v\rangle,$$

and $b_z$, $b_u$ and $b_v$ are dual variables of the augmented Lagrangian.

22. The computer readable program storage device of claim 21, the method further comprising updating the dual variables as $$b_z^{k+1} = b_z^k + (Wx^{k+1} - z^{k+1}),$$

$$b_u^{k+1} = b_u^k + (u^{k+1} - Fv^{k+1} + y), \text{ and}$$

$$b_v^{k+1} = b_v^k + (Sx^{k+1} - v^{k+1}).$$

23. The computer readable program storage device of claim 21, wherein $\varepsilon \leq \|y\|_2$.

24. The computer readable program storage device of claim 21, wherein $\mu_1$, $\mu_2$, and $\mu_3$ are set as $\mu_1 = \mu_3 = 0.1\rho$ and $\mu_2 = \rho$ wherein $$\rho = \frac{1}{0.01 \|WA^H y\|_\infty}.$$

25. The computer readable program storage device of claim 22, wherein $x^k, z^k, v^k,$ and $u^k$, and dual variables $b_z^k, b_u^k,$ and $b_v^k$ are initialized to zero.

26. The computer readable program storage device of claim 21, wherein $x^k, z^k, v^k$ and $u^k$ are updated until a relative difference between a current iteration estimate and a previous iteration estimate fall below a predefined threshold.

* * * * *